(12) United States Patent
De Boeij et al.

(10) Patent No.: US 8,351,022 B2
(45) Date of Patent: Jan. 8, 2013

(54) RADIATION BEAM MODIFICATION APPARATUS AND METHOD

(75) Inventors: Wilhelmus Petrus De Boeij, Veldhoven (NL); Leon Martin Levasier, Hedel (NL)

(73) Assignee: ASML Netherlands B.V., Veldhoven (NL)

( * ) Notice: Subject to any disclaimer, the term of this patent is extended or adjusted under 35 U.S.C. 154(b) by 436 days.

(21) Appl. No.: 12/774,284

(22) Filed: May 5, 2010

(65) Prior Publication Data

US 2010/0315612 A1 Dec. 16, 2010

Related U.S. Application Data

(60) Provisional application No. 61/187,161, filed on Jun. 15, 2009.

(51) Int. Cl.
| G02B 5/22 | (2006.01) |
| G02B 26/02 | (2006.01) |
| G03B 27/32 | (2006.01) |
| G03B 27/42 | (2006.01) |
| G03B 27/54 | (2006.01) |
| G03B 27/72 | (2006.01) |

(52) U.S. Cl. ............... 355/71; 355/53; 355/67; 355/77; 359/236; 359/889

(58) Field of Classification Search ............... 250/492.2, 250/548, 559.01–559.3; 355/30, 53, 67, 355/71, 77; 359/234, 236, 361, 889; 430/5
See application file for complete search history.

(56) References Cited

U.S. PATENT DOCUMENTS

| 2006/0170895 A1 | 8/2006 | Fiolka |
| 2007/0013890 A1 | 1/2007 | Loopstra et al. |

*Primary Examiner* — Hung Henry Nguyen
*Assistant Examiner* — Colin Kreutzer
(74) *Attorney, Agent, or Firm* — Sterne, Kessler, Goldstein & Fox P.L.L.C.

(57) ABSTRACT

A radiation beam modification apparatus for controlling a property of a beam of radiation in a lithographic apparatus includes a flexible sheet provided with a plurality of apertures, and a positioning apparatus comprising a first rotatable member and a second rotatable member, wherein a first end portion of the flexible sheet is coupled to the first rotatable member, a second end portion of the flexible sheet is coupled to the second rotatable member and a central portion of the flexible sheet extends between the first rotatable member and the second rotatable member. The apertures may be used to control the numerical aperture of a projection system of a lithographic apparatus.

19 Claims, 6 Drawing Sheets

Figure 5

RADIATION BEAM MODIFICATION APPARATUS AND METHOD

CROSS REFERENCE TO RELATED APPLICATIONS

This application claims the benefit under 35 U.S.C. §119 (e) to U.S. Provisional Patent Application No. 61/187,161, filed Jun. 15, 2009, which is incorporated by reference herein in its entirety.

FIELD

Embodiments of the present invention relate to a radiation beam modification apparatus and method. Embodiments of the present invention also relate to a lithographic apparatus including the radiation beam modification apparatus and method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 \lambda / NA_{PS} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and thus reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving printing of small features. Such radiation is termed extreme ultraviolet or soft x-ray, and possible sources include, for example, laser-produced plasma sources, discharge plasma sources, or synchrotron radiation from electron storage rings.

EUV lithographic apparatus typically include reflective optics rather than transmissive optics as used in conventional deep ultraviolet (DUV) lithographic apparatus. For this reason, it may not be possible to transfer known optical systems and components used in a DUV lithographic apparatus to an EUV lithographic apparatus.

SUMMARY OF INVENTION

A radiation beam modification apparatus and method which is suitable for use in an EUV lithographic apparatus is provided.

According to a first aspect of the invention there is provided a radiation beam modification apparatus for controlling a property of a beam of radiation in a lithographic apparatus, the radiation beam modification apparatus including a flexible sheet provided with a plurality of apertures, and a positioning apparatus including a first rotatable member and a second rotatable member, wherein a first end portion of the flexible sheet is coupled to the first rotatable member, a second end portion of the flexible sheet is coupled to the second rotatable member and a central portion of the flexible sheet extends between the first rotatable member and the second rotatable member.

According to a second aspect of the present invention there is provided a lithographic apparatus including an illumination system for providing a beam of radiation, a support structure for supporting a patterning device, the patterning device serving to impart the radiation beam with a pattern in its cross-section, a substrate table for holding a substrate, and a projection system for projecting the patterned radiation beam onto a target portion of the substrate, wherein the lithographic apparatus further includes a radiation beam modification apparatus according to the first aspect of the invention.

According to a third aspect of the present invention there is provided a method of modifying a property of a radiation beam in a lithographic apparatus, the method including providing a flexible sheet including a plurality of apertures, providing positioning apparatus including a first rotatable member and a second rotatable member, a first end portion of the flexible sheet being coupled to the first rotatable member, a second end portion of the flexible sheet being coupled to the second rotatable member, and a central portion of the flexible sheet extending between the first rotatable member and the second rotatable member, and using the positioning apparatus to position an aperture in the optical path of the beam of radiation and thereby modify a property of the radiation beam.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1A:
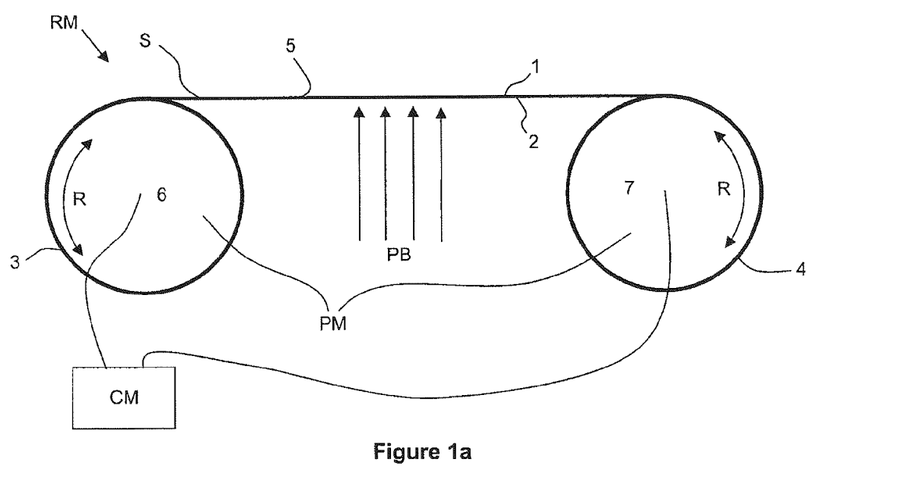
FIGS. 1a, 1b, and 1c depicts a radiation beam modification apparatus according to an embodiment of the invention.

FIG. 1a depicts a side view of a radiation beam modification apparatus RM according to an embodiment of the invention. The radiation beam modification apparatus RM includes a flexible sheet S, a positioning apparatus PM and control system CM.

Flexible sheet S is a masking element that is configured to modify the diameter and/or shape of a radiation beam. Flexible sheet S may be used to define the numerical aperture of the radiation beam (e.g., by modifying the radial extent of the radiation beam in a pupil plane of the radiation beam).

Flexible sheet S has an upper surface 1, lower surface 2, first end portion 3 and second end portion 4. Flexible sheet S may be configured such that, in use, a beam of radiation PB is incident on a surface of the flexible sheet (e.g., on the lower surface 2 as shown in FIG. 1a).

First end portion 3 of flexible sheet S is coupled to a first rotatable member 6 of positioning apparatus PM. Likewise, second end portion 4 of flexible sheet S is coupled to a second rotatable member 7 of positioning apparatus PM. A central portion 5 of flexible sheet S extends between first rotatable member 6 and second rotatable member 7. In an embodiment, rotatable members 6, 7 have substantially cylindrical outer surfaces. The rotatable members may be rotated clockwise or anticlockwise, as indicated by double headed arrows R. Flexible sheet S may be wrapped around one or both of rotatable members 6, 7 a plurality of times.

In an embodiment, flexible sheet S has a substantially flat, elongate configuration. Flexible sheet S is sufficiently flexible that it can be wound around, and unwound from, rotatable members 6, 7. The flexible sheet may be substantially ribbon-like.

Flexible sheet S is sufficiently flexible to allow it to be wound around and unwound from rotatable members 6, 7. In addition, flexible sheet S is sufficiently thick that it has enough structural strength to function correctly. For example, flexible sheet S may be sufficiently thick that it maintains integrity across its shape. Additionally or alternatively, the flexible sheet may be pre-tensioned and/or include supporting means to help maintain integrity and thereby avoid any sagging and/or misalignment. The rigidity or stiffness of the material used to make flexible sheet S may be taken into account when determining an appropriate thickness for the flexible sheet. Flexible sheet S may for example be less than 500 microns thick. Flexible sheet S may for example be more than 10 microns thick.

Flexible sheet S acts as a masking element, and is sufficiently opaque to block radiation beam PB when the radiation beam is incident on a surface of the flexible sheet. Flexible sheet S may be foamed from a material that is substantially opaque at the wavelength or wavelengths of the radiation beam PB.

Flexible sheet S may be formed from a metal material. The metal material may be a metal, or any suitable metallic composite material such as stainless steel. The metal material may additionally or alternatively include titanium and/or tantalum (these provide improved heat dissipation compared with stainless steel). A flexible sheet S formed from a metal material may be referred to as a foil.

Figure 1B:
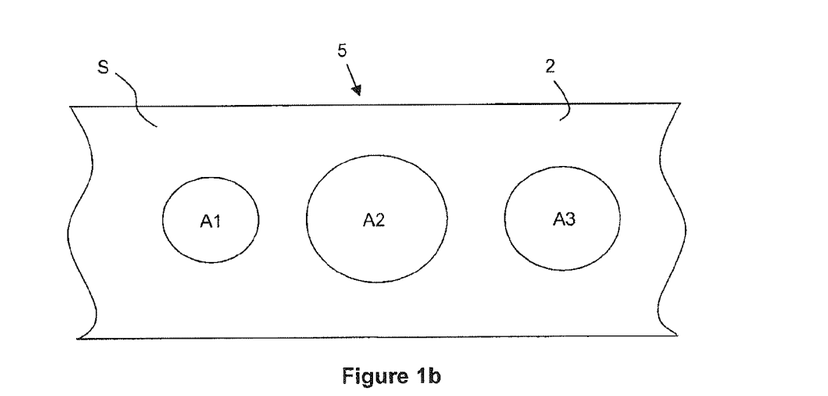

Flexible sheet S includes a plurality of apertures, each aperture having a different configuration (e.g., size and/or shape). FIG. 1b shows central portion 5 of flexible sheet S as viewed from above. Three apertures A1, A2, A3 can be seen, each aperture having a different diameter. Other additional apertures may be provided in flexible sheet S. Any suitable number of apertures may be provided in the flexible sheet. The apertures may have different shapes and/or sizes. Since flexible sheet S may be wrapped around one or both of rotatable members 6, 7 a plurality of times, a large number of apertures may be provided on the flexible sheet. For example, more than 5 apertures, more than 10 apertures, or more than 20 apertures.

Figure 1C:
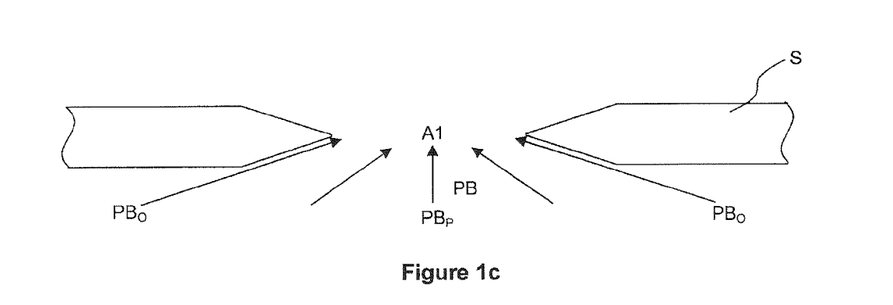

FIG. 1c shows part of flexible sheet S and an aperture A1 in cross-section. As can be seen in FIG. 1c, flexible sheet S tapers inwardly towards aperture A1. This allows radiation PB to pass through aperture A1 which would otherwise be blocked by the aperture. The thickness of flexible sheet S has been exaggerated in FIG. 1c, in order to show the tapering more clearly.

Radiation beam PB includes rays which are incident at aperture A1 from a range of different angles. A few of these angles are represented schematically by arrows in FIG. 1c. The angular extent of the radiation beam depends upon optical properties of a lithographic apparatus within which flexible sheet S is provided. A central radiation beam ray $PB_P$ is perpendicularly incident at the aperture, and is referred to here as the perpendicular ray $PB_P$. Rays which subtend the greatest angle relative to the perpendicular ray $PB_P$ are referred to here as oblique rays $PB_O$.

The angle of the tapering of flexible sheet S is such that oblique rays $PB_O$ pass unobstructed through aperture A1. The angle of the tapering may be selected based upon the optical design of the lithographic apparatus (numerical aperture and optical field extent), and the thickness of flexible sheet S. Tapering flexible sheet S in this manner avoids vignetting of radiation beam PB (all field points in the radiation beam experience the same numerical aperture).

In operation, flexible sheet S is positioned using positioning apparatus PM such that one of the apertures is located in the optical path of radiation beam PB. The aperture acts to restrict/control the diameter and/or shape of radiation beam PB. The aperture may be used for example to control the numerical aperture of a projection system of a lithographic apparatus, as is described further below.

Flexible sheet S is positioned by simultaneously rotating rotatable members 6, 7 in the same direction, such that the flexible sheet is unwound from one rotatable member and wound onto the other rotatable member. In the radiation beam modification apparatus depicted in FIG. 1a, flexible sheet S may be moved to the right by simultaneously rotating rotatable members 6, 7 in a clockwise direction. Where this is done, a portion of flexible sheet S is unwound from first rotatable member 6 and a portion of the flexible sheet is wound onto second rotatable member 7. Likewise, flexible sheet S may be moved to the left by simultaneously rotating rotatable members 6, 7 in an anti-clockwise direction. Where this is done, a portion of flexible sheet S is wound onto first rotatable member 6 and a portion of the flexible sheet is unwound from second rotatable member 7.

The rotatable members may be driven by one or more actuators (not illustrated), which are controlled by control means CM. The actuator may include a single motor which is configured to simultaneously drive both rotatable members 6, 7. Alternatively, the actuators may include a first motor configured to drive first rotatable member 6 and a second motor configured to drive second rotatable member 7. The one or more actuators may be compatible for use in a controlled environment such as a vacuum. The one or more actuators may include one or more vacuum compatible Lorentz Motors.

Control means CM controls the position of flexible sheet S using the actuators. The control means is configured to select a particular aperture (e.g., A2) from the plurality of apertures A1-A3 in flexible sheet 5, and then control rotatable members 6, 7 to position the flexible sheet such that the selected aperture is located in the optical path of radiation beam PB.

A selected aperture of flexible sheet S may be positioned with sufficient accuracy to provide a desired modification of a property of radiation beam PB, without significantly compromising other properties of the radiation beam. For example, flexible sheet S may be positioned with sufficient accuracy that radiation beam PB is not clipped on one side by the aperture whilst being unaffected on an opposite side by the aperture.

Figure 2A:
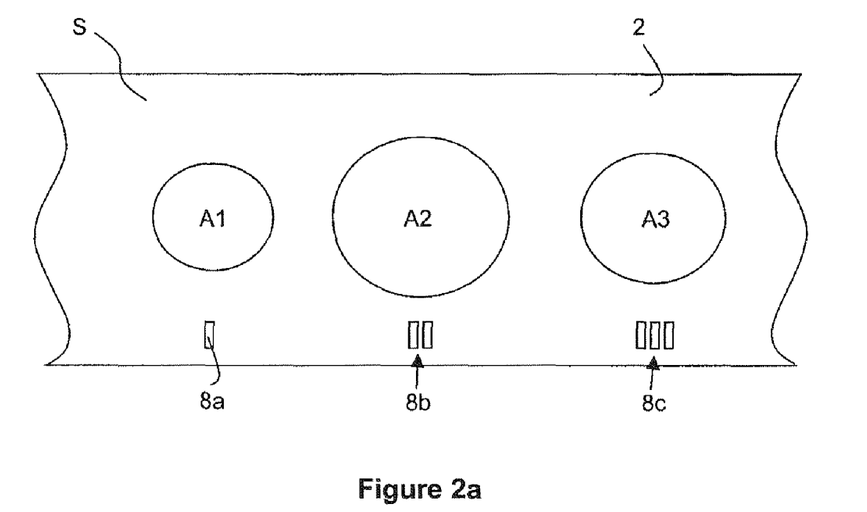
FIG. 2a-2b depicts a radiation beam modification apparatus which has been provided with an alignment system, according to an embodiment of the invention.
Figure 2B:
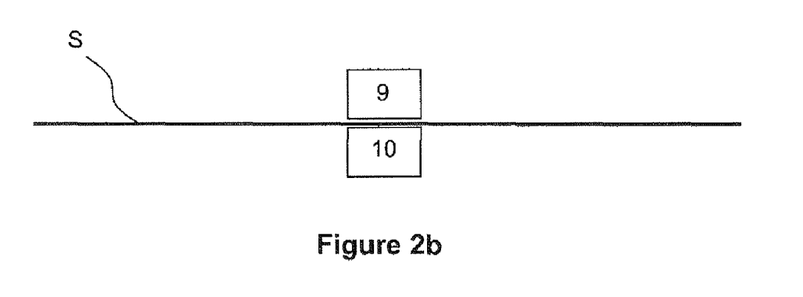

The radiation beam modification apparatus may be provided with one or more position monitoring systems, which may be used to monitor the position of flexible sheet S. Referring to FIG. 2a, flexible sheet S may be provided with a plurality of alignment marks. The alignment marks are rectangular openings 8a-c, each alignment mark including a different number of rectangular openings. Referring to FIG. 2b, a radiation source 9 is provided above flexible sheet 5, and a detector 10 is provided below the flexible sheet. The detector detects radiation from the radiation source which has passed though rectangular openings 8a-c. Detector 10 may be connected to the control means CM (not shown in FIG. 2).

In use, second aperture A2 may for example be aligned with radiation beam PB. The control means may instruct rotatable members 6, 7 to rotate anticlockwise until third aperture A3 is aligned with the radiation beam. Rotatable members 6, 7 rotate anticlockwise until detector 10 detects three areas of radiation. The three areas of radiation are seen when three rectangular openings 8c associated with third aperture A3 are located over detector 10. The rotatable members stop rotating when the three areas of radiation are in the middle of a detection area of detector 10 (if it is the case that the centre of the detection area is aligned with the centre of radiation beam PB). Rectangular openings 8a-c may be used to position any of the apertures A1-3.

Rectangular openings 8a-c are an example of alignment marks which may be used. However, any suitable alignment marks may be used.

In FIG. 2a, the alignment marks associated with each aperture are different, and may be used to provide identification of an aperture. In an alternative arrangement, the alignment marks associated with each aperture may be the same. Where this is the case, the control means may be configured to control rotatable members 6, 7 with a sufficient degree of accuracy to ensure that a particular aperture is close to a desired aligned position. The alignment mark may then be used to provide fine adjustment of the position of the aperture, for example using a source 9 and detector 10 as described above. In this situation, it is not necessary for the alignment mark to identify the aperture. This allows the alignment marks to all be the same.

Aperture identifiers may be provided which are separate from the alignment marks. For example, a letter, number or other code may be provided adjacent to each aperture. The letter, number or other code may for example be read by an imaging detector. In this situation, the alignment marks may all be the same.

A linear encoder may be used monitor the position of flexible sheet S, and to align a desired aperture with radiation beam PB. A scale which is read by the linear encoder may be provided on the flexible sheet (e.g., along an edge of the flexible sheet).

Rotatable members 6, 7 may be controlled with sufficient accuracy that alignment marks or a linear encoder are not required. For example, the orientation of rotatable members 6, 7 may be controlled sufficiently accurately that a given aperture can be aligned with radiation beam PB with a desired accuracy.

It may be possible to control the position of an aperture to an accuracy of for example +/−50 μm, or some other suitable accuracy.

Radiation incident on a surface of flexible sheet S may cause an undesirable heating effect. Hence, radiation beam modification apparatus RM may further include cooling apparatus to help dissipate heat from flexible sheet S caused by incident radiation. The cooling apparatus may include a cooling fluid flowing along one or more cooling pipes or tubes. The cooling fluid may include water, hydrogen gas or any other suitable fluid. Cooling pipes may be arranged adjacent and separate from lower surface 2 and/or upper surface 1 of flexible sheet S.

The cooling pipes may be separated from flexible sheet S by a distance of a few millimeters (for example 1 to 3 mm). This may provide sufficient cooling for example if flexible sheet S and cooling pipes are in a low pressure environment (e.g., a pressure of a few Pascals). The low pressure environment may for example include hydrogen gas.

The cooling pipes may be alternatively arranged in touching contact with lower surface 2 and/or upper surface 1 of the flexible sheet.

The cooling pipes may be positioned such that they do not obscure an aperture which is aligned with radiation beam PB.

Figure 3A:
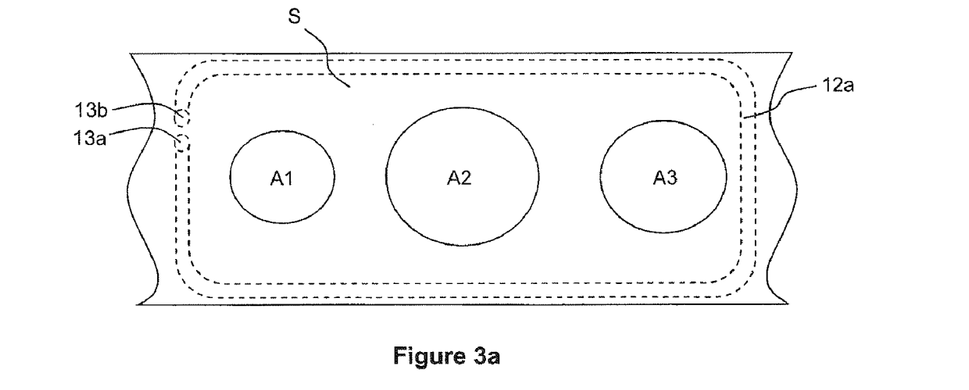
FIGS. 3a-e depict embodiments of a radiation beam modification apparatus which have been provided with cooling systems.

FIG. 3a shows part of flexible sheet S viewed from above, with a cooling pipe 12a provided beneath the flexible sheet in a loop configuration. The loop configuration is arranged so as to extend substantially peripherally around an outer region of lower surface 2 of the flexible sheet. Cool fluid may be delivered to the loop at an input 13a, and heated fluid may be removed from the loop at an output 13b. Input 13a and output 13b may both extend downwardly away from flexible sheet S.

Figure 3B:
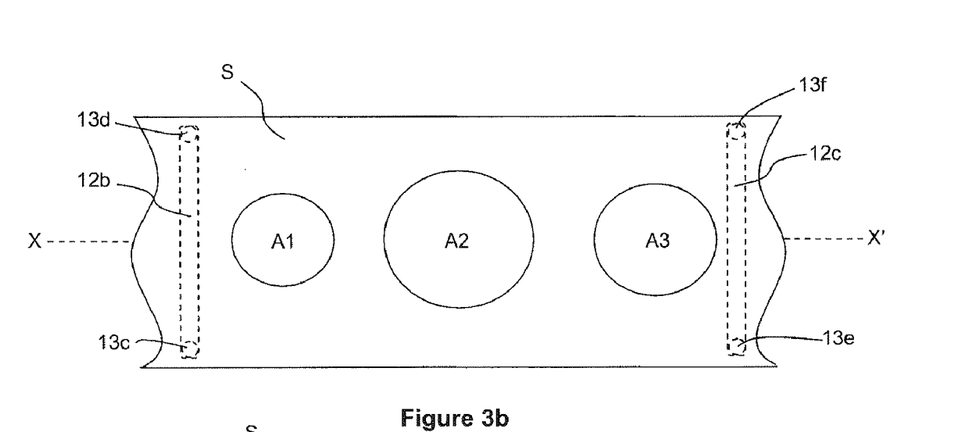
Figure 3C:
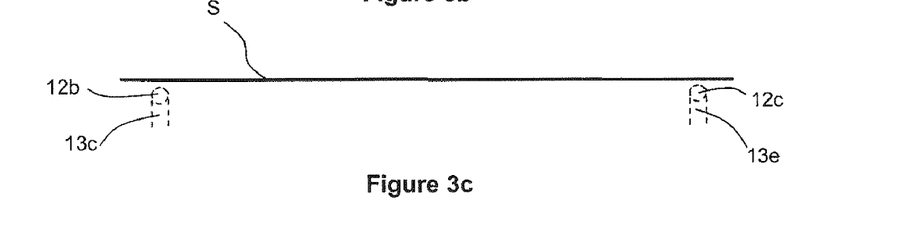

FIGS. 3b and 3c show the flexible sheet S and a cooling apparatus viewed respectively from above and from one side. The cooling apparatus includes first and second cooling pipes 12b, 12c. Cooling pipes 12b, 12c are arranged to extend in a substantially perpendicular direction with respect to a longitudinal axis X-X' of flexible sheet S. First cooling pipe 12b is located at a left hand end of flexible sheet S, and second cooling pipe 12c is located at a right hand end of the flexible sheet. Each cooling pipe 12b, 12c has a fluid input 13c, 13e and a fluid output 13d, 13f.

First cooling pipe and second cooling pipe 12b, 12c are arranged adjacent to and separate from the lower surface of flexible sheet S, as can be seen in FIG. 3c. The separation between cooling pipes 12b, 12c may for example be a few millimeters (e.g., in the range of 1-3 mm).

Figure 3D:
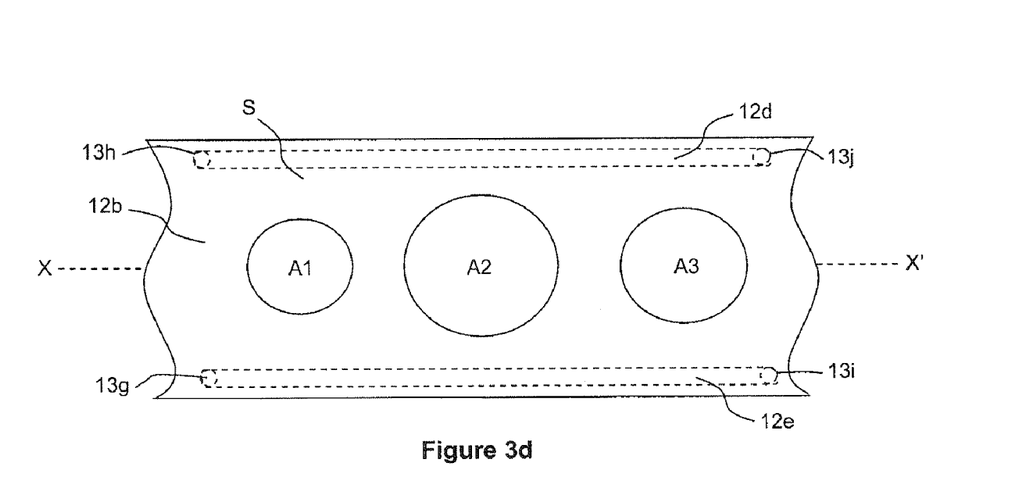
Figure 3E:
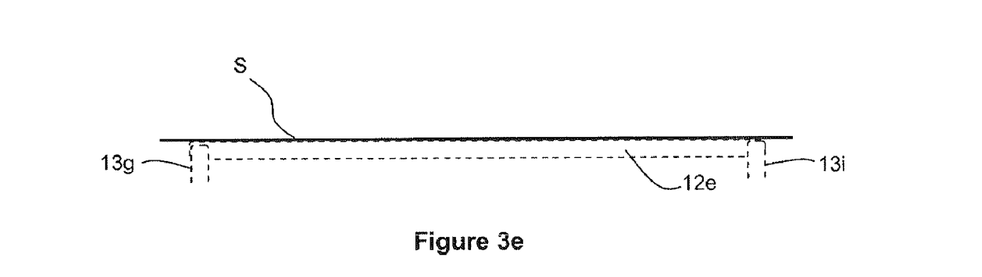

FIGS. 3d and 3e show flexible sheet S and a cooling apparatus viewed respectively from above and from one side. The cooling apparatus includes first and second cooling pipes 12d, 12e arranged to extend in a direction substantially parallel to the longitudinal axis X-X' of flexible sheet S. Cooling pipes 12d, 12e are located adjacent to edges of flexible sheet S. Each cooling pipe 12d, 12e has a fluid input 13h, 13g and a fluid output 13j, 13i. First cooling pipe 12d and second cooling pipe 12e are in touching contact with the lower surface of flexible sheet S.

FIGS. 3a to 3e provide examples of particular cooling pipe arrangements. However, the cooling apparatus may include one or more cooling pipes in any suitable arrangement. The cooling pipes may be in contact with flexible sheet S, or may be separate from the flexible sheet. Providing the cooling pipes in contact with flexible sheet S may provide more efficient cooling, but may lead to wear of the flexible sheet over time. Providing the cooling pipes separate from the flexible sheet may provide less efficient cooling, but may avoid wear of the flexible sheet.

Radiation beam modification apparatus RM may additionally or alternatively include one or more heat shields (not illustrated) to help reduce the heating effect of incident radiation. The one or more heat shields may be arranged adjacent and separate from upper surface 1 and/or lower surface 2 of flexible sheet S. Alternatively or additionally, the one or more heat shields may be arranged in touching contact with upper surface 1 and/or lower surface 2 of flexible sheet S. As with the cooling pipes of the cooling apparatus, the one or more heat shields may be positioned so as not to interfere with the apertures or beam of radiation.

Radiation beam modification apparatus RM has a substantially compact configuration. As a result, unwanted physical interference with other optical components may be avoided. The radiation beam modification apparatus has a substantially simplistic construction and so may be reasonably straightforward to manufacture and maintain. The radiation beam modification apparatus may be suitable for use in a controlled environment, such as a vacuum.

The radiation beam modification apparatus is suitable for use in a lithographic apparatus, for example a DUV lithographic apparatus or an EUV lithographic apparatus.

Figure 4:
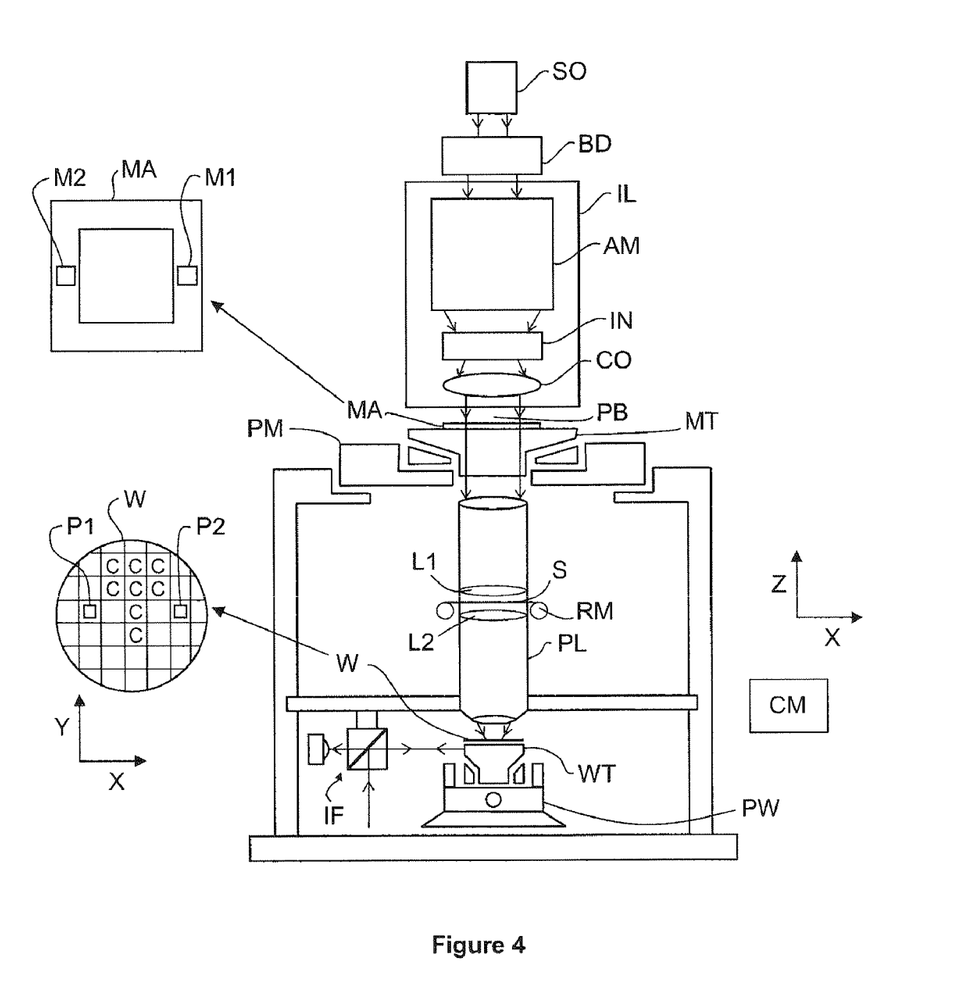
FIG. 4 depicts a lithographic apparatus according to an embodiment of the invention.

FIG. 4 schematically depicts a lithographic apparatus which embodies the invention. The apparatus includes an illumination system (illuminator) IL configured to provide a beam of radiation PB (e.g., DUV radiation), a first support (e.g., a mask table) MT configured to support a patterning device (e.g., a mask) MA and connected to a first positioning device PM that accurately positions patterning device MA with respect to a projection system PL, a substrate table (e.g., a wafer table) WT configured to hold a substrate (e.g., a resist-coated wafer) W and connected to second positioning device PW that accurately positions substrate W with respect to projection system PL, and a projection system (e.g., a reflective projection lens) PL configured to image a pattern imparted to beam of radiation PB by patterning device MA onto a target portion C (e.g., including one or more dies) of substrate W. Patterning device MA is configured to impart the beam of radiation PB with a pattern in its cross section.

As here depicted, the apparatus is of a transmissive type (e.g., employing a transmissive mask). Alternatively, the apparatus may be of a reflective type (e.g., employing a reflective mask or a programmable mirror array).

Illumination system IL receives radiation from a source SO. Source SO and the lithographic apparatus may be separate entities. In such cases, source SO is not considered to form part of the lithographic apparatus and the radiation is generally passed from source SO to illumination system IL with the aid of a radiation collector including, for example, suitable collecting mirrors and/or a spectral purity filter. In other cases source SO may be an integral part of the apparatus. Source SO and illumination system IL may be referred to as a radiation system.

Illumination system IL may include adjusting means AM for adjusting the angular intensity distribution of the beam or radiation. This may allow adjustment of for example, at least the outer and/or inner radial extent (commonly referred to as σ-outer and σ-inner, respectively) of the intensity distribution in a pupil plane of illumination system IL can be adjusted. In addition, illumination system IL generally includes various other components such as an integrator IN and coupling optics CO. The integrator, which may for example be a quartz rod, improves the homogeneity of the radiation beam. Illumination system IL provides a conditioned beam of radiation PB having a desired uniformity and intensity distribution in its cross-section.

Upon leaving illumination system IL, beam of radiation PB is incident on mask MA, which is held on mask table MT. Being transmitted by mask MA, beam of radiation PB passes through projection system PL, which focuses the beam onto a target portion C of substrate W. With the aid of second positioning device PW and position sensor IF2 (e.g., an interferometric device), substrate table WT can be moved accurately, e.g., so as to position different target portions C in the path of beam PB. Similarly, first positioning device PM and position sensor IF1 (e.g., an interferometric device) can be used to accurately position mask MA with respect to the path of beam PB, e.g., after mechanical retrieval from a mask library, or during a scan. In general, movement of object tables MT and WT will be realized with the aid of a long-stroke module (coarse positioning) and a short-stroke module (fine positioning), which form part of positioning devices PM and PW. However, in the case of a stepper, as opposed to a scanner, mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, mask table MT and substrate table WT are kept essentially stationary, while an entire pattern imparted to the beam of radiation is projected onto a target portion C at once (i.e., a single static exposure). Substrate table WT is then shifted in the X and/or Y direction so that a different target portion C can be exposed. In step mode, the maximum size of the exposure field limits the size of the target portion C imaged in a single static exposure 2. In scan mode, mask table MT and substrate table WT are scanned synchronously while a pattern imparted to the beam of radiation is projected onto a target portion C (i.e., a single dynamic exposure). The velocity and direction of substrate table WT relative to mask table MT is determined by the (de-)magnification and image reversal characteristics of projection system PL. In scan mode, the maximum size of the exposure field limits the width in the non-scanning direction of the target portion in a single dynamic exposure, whereas the length of the scanning motion determines the height in the scanning direction of the target portion.

3. In another mode, mask table MT is kept essentially stationary holding a programmable patterning device, and substrate table WT is moved or scanned while a pattern imparted to the beam of radiation is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus also includes radiation beam modification apparatus RM. Radiation beam modification apparatus RM is located in or adjacent to a pupil plane of projection system PL. Flexible sheet S of radiation beam modification apparatus RM extends between two lenses L1, L2 of projection system PL (other lenses may be present in the project system but are not illustrated). FIG. 4 also shows control system CM which may be used to control the position of flexible sheet S. For ease of illustration, electric connections from control system CM are omitted from FIG. 4. Control system CM may be configured to control operation of radiation beam modification apparatus RM such that a selected aperture is located in the optical path of radiation beam PB in projection system PL.

Radiation beam modification apparatus RM may be configured to control numerical aperture $NA_{PL}$ of radiation beam PB in projection system PL, or some other property of the radiation beam.

Radiation beam modification apparatus RM may be provided in illumination system IL, for example in adjusting means AM. The radiation beam modification apparatus may be used to modify the numerical aperture $NA_{IL}$ of radiation beam PB in the illumination system, or some other property of the radiation beam.

Figure 5:
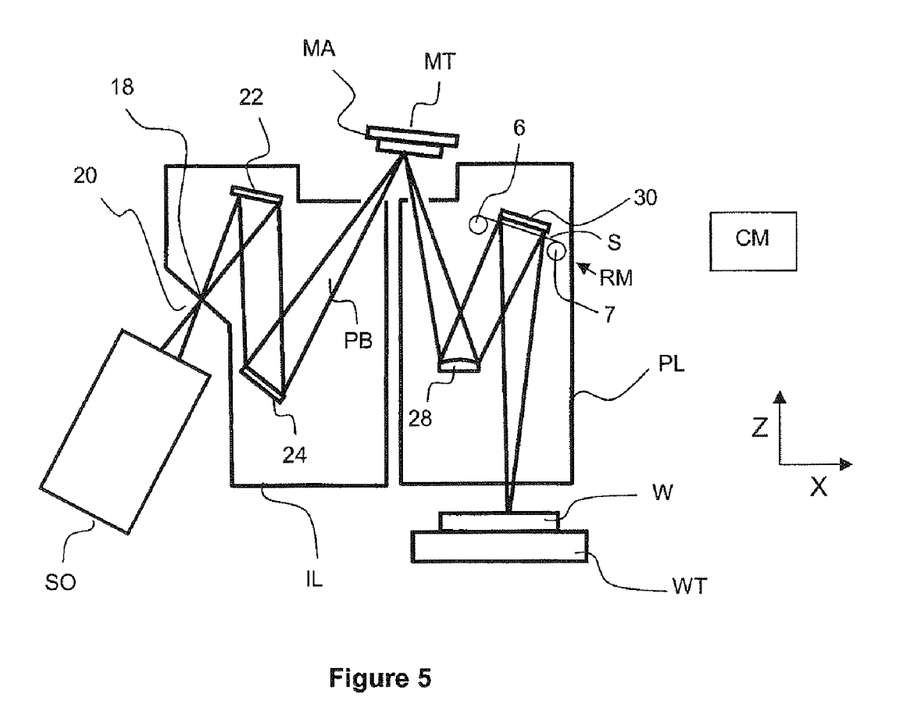
FIG. 5 depicts an alternative lithographic apparatus according to an embodiment of the invention.

FIG. 5 shows schematically a side view of an EUV lithographic apparatus according to a further embodiment of the invention. The lithographic apparatus includes a collector assembly/radiation source SO, an illumination system IL, and a projection system PL.

Radiation from a radiation generator is focused by the collector assembly/radiation source SO into a virtual source point collection focus 18 at an entrance aperture 20 in illumination system IL. A beam of radiation PB is reflected in illumination system IL via first and second reflectors 22, 24 onto a mask MA (or other patterning device) positioned a mask table MT. Radiation beam PB is patterned and is imaged in projection system PS via first and second reflective elements 28, 30 onto a substrate W held on a substrate table WT.

It will be appreciated that more or fewer elements than shown in FIG. 5 may generally be present in collector assembly/radiation source SO, illumination system IL, and projection system PS. For instance, in some embodiments the lithographic apparatus may also include one or more transmissive or reflective spectral purity filters. More or less reflective elements may be present in a lithographic apparatus.

The lithographic apparatus also includes radiation beam modification apparatus RM. Radiation beam modification apparatus RM is located adjacent to second reflective element 30, which lies in a pupil plane of projection system PL. Radiation beam modification apparatus RM thus may be described as being adjacent to a pupil plane of the radiation beam modification apparatus. Flexible sheet S of radiation beam modification apparatus RM extends laterally across the optical path of radiation beam PB in projection system PL. Radiation beam modification apparatus RM may be used to control the numerical aperture $NA_{PL}$ of radiation beam PB in projection system PL, or some other property of the radiation beam.

Radiation beam modification apparatus RM is positioned such that rotatable members 6, 7 extend in the y-direction. However, radiation beam modification apparatus RM may be positioned such that rotatable members 6, 7 extend in the x-direction. This may be desirable for example if radiation beam PB passes close to second reflective element 30 before being incident on first reflective element 28. Where this is the case, there may be insufficient room for a rotatable member to be accommodated between second reflective element 30 and radiation beam PB. In this situation, positioning radiation beam modification apparatus RM such that rotatable members 6, 7 extend in the x-direction avoids this problem (the rotatable members are not located between second reflective element 30 and radiation beam PB).

FIG. 5 also shows control system CM which may be used to control the position of flexible sheet S. For ease of illustration, electric connections from control system CM are omitted from FIG. 5. Control means CM may be configured to control operation of radiation beam modification apparatus RM such that a selected aperture is located in the optical path of radiation beam PB in projection system PL.

Radiation beam modification apparatus RM may be provided in illumination system IL. The radiation beam modification apparatus may be used to modify the numerical aperture $NA_{IL}$ of radiation beam PB in the illumination system, or some other property of the radiation beam.

As is shown in FIGS. 4 and 5, radiation beam modification apparatus RM may be provided in a DUV lithographic apparatus or an EUV lithographic apparatus. In both cases, the radiation beam modification apparatus may be used to adjust the numerical aperture of projection system PL or the illumination system. For example, an aperture selected by control means CM from the plurality of different apertures in flexible sheet S may be selected so as to define a desired numerical aperture of the radiation beam in the projection system or the illumination system.

By appropriately controlling the numerical aperture $NA_{PL}$ of radiation beam PB in projection system PL or the illumination system, the optical performance of the lithographic apparatus may be improved or optimized. For example, the numerical aperture $NA_{PL}$ of the projection system may be selected with reference to a pattern to be projected from mask MA by the projection system. Smaller pattern features require a larger projection system numerical aperture $NA_{PL}$. If the pattern features on a mask MA are larger, then it may be desirable to reduce the numerical aperture of the projection system, since this provides a larger depth of focus of the image formed at substrate W (thereby making the lithographic apparatus less subject to focusing errors).

The numerical aperture of radiation beam PB in the illumination system and/or projection system may be controlled so as to allow for example for a desirable uniformity, telecentricity or ellipticity of the radiation beam.

Radiation beam modification apparatus RM may also be used to adjust the coherence factor σ of the lithographic apparatus. The coherence factor σ of a lithographic apparatus is a measure of the ratio of the NA in the illumination system to the NA in the projection system. The coherence factor σ depends on the illumination mode of the radiation beam. An increase or decrease in the numerical aperture may have a detrimental effect on the coherence factor σ and consequently the imaging performance of the lithographic apparatus. Thus, the numerical aperture of the radiation beam in the projection system and/or the illumination system may be controlled so as to achieve a desired coherence factor σ in accordance with the illumination mode of the radiation beam.

Radiation beam modification apparatus RM may be provided in illumination system IL of the lithographic apparatus (either a DUV lithographic apparatus or an EUV lithographic apparatus). The radiation beam modification apparatus may be used to modify the numerical aperture $NA_{IL}$ of radiation beam PB in the illumination system. The radiation beam modification apparatus may also be used to modify the shape of a radiation beam illumination mode delivered to mask MA by the illumination system. The shape of the illumination mode may be selected for example to maximize the amount of radiation captured by the projection system which has been diffracted by mask MA.

The control means may determine the desired numerical aperture of the radiation beam by detecting one or more parameters of the pattern provided on mask MA. Alternatively or additionally, the control means may receive information regarding properties of the lithographic apparatus, for example the wavelength of radiation, the depth of focus tolerance, the illumination mode and/or the coherence factor σ etc. Alternatively or additionally, the control means may receive information regarding properties of mask MA, and may in addition receive instructions regarding an appropriate numerical aperture to use in connection with that mask.

The control means may continuously, or intermittently over a predetermined time period, receive data regarding optical parameters of the lithographic apparatus. Properties of the lithographic apparatus may be modified in response to this data using the radiation beam modification apparatus.

When a change to the numerical aperture (or other property) of radiation beam PB is desired, the rotatable members of flexible sheet S are controlled so as to move a selected aperture into the optical path of the radiation beam. The selected aperture will provide the desired modification of the numerical aperture of projection system PL.

Radiation beam modification apparatus RM may be used to modify properties of the radiation beam other than the numerical aperture. For example, the radiation beam modification apparatus may be used to modify the mode shape of the radiation beam. This may be done by providing apertures in flexible sheet S which correspond with desired mode shapes. For example, apertures arranged to provide a dipole mode, quadrupole mode, or any other suitable mode may be provided.

Flexible sheet S may be provided with apertures of any shape. A plurality of apertures may be provided which are configured to act together on radiation beam PB (e.g., two apertures which form a dipole mode).

Radiation beam modification apparatus RM may be substantially arranged within a controlled environment of projection system PL (e.g., as shown in FIG. 5). In an alternative arrangement, a central portion of flexible sheet S may be arranged within the controlled environment, with the rotatable members and first and second end portions of the flexible sheet located outside of the controlled environment (e.g., as shown in FIG. 4). This alternative arrangement allows access to some component parts of the rotatable members. The rotatable members and first and second end portions of the flexible sheet may be located in an additional controlled environment. This may allow component parts of the rotatable members to be accessed without breaking the vacuum of the projection system, and reduces the risk of flexible sheet S becomes contaminated.

The control means may be provided inside or outside of the controlled environment.

Projection system PL may be operated in a controlled environment which does not include a vacuum. For example, some projection systems operate in an environment purged with nitrogen gas. Radiation beam modification apparatus RM described above for moving a flexible sheet into and out of a vacuum chamber may apply equally to any controlled environment.

In FIGS. 1 and 4, radiation beam modification apparatus RM is oriented such that flexible sheet S is horizontal and is above rotatable members 6, 7. However, radiation beam modification apparatus RM may have any orientation. For example, flexible sheet S may be horizontal and below rotatable members 6, 7. Alternatively, flexible sheet S may be at an angle relative to the horizontal (for example as shown in FIG. 5).

In lithographic apparatus, apertures are used in the projection system and/or illumination system include to control the numerical aperture (or other property) of the radiation beam. In one example, a mechanical iris is used to provide an aperture which has an adjustable diameter. In another example, a series of individual stop discs are provided, each having a different aperture. A mechanical disc changer mechanism is used to select and locate a particular stop disc.

In a lithographic apparatus using reflective optics, e.g., an EUV lithographic apparatus, the space around the optical components is very restricted. Sufficient space may not be available to accommodate other aperture adjustment systems, which may be large and bulky and therefore unsuitable for use in an EUV lithographic apparatus.

Other aperture adjustment systems may suffer from other disadvantages. For example, they may be complex, slow to operate, expensive to both manufacture and operate, and may also provide a significant risk of introducing contamination. For example, the changing of the aperture stop discs by the mechanical disc changer mechanism may increase the chance of introducing contaminants into the projection system and/or illumination system at the same time. Moreover, although the mechanical disc changer mechanism is designed to be as reliable as possible it nevertheless requires servicing on occasion (e.g., so as to ensure the discs continue to be positioned accurately.) This is both time consuming, expensive and may also lead to contamination of the apparatus.

U.S. Pat. Appl. Publ. No. 2006/0170895, which is incorporated by reference herein in its entirety, describes an apparatus which uses a printer to print gray tones onto a foil that intersects a radiation beam of a lithographic apparatus. The printed foil is used to modify the intensity distribution of the radiation beam. However, U.S. Pat. Appl. Publ. No. 2006/0170895 does not describe providing an aperture in the foil which may be used to modify a property of the radiation beam. Furthermore, the apparatus described in U.S. Pat. Appl. Publ. No. 2006/0170895 is complex and bulky. Printing onto the foil is likely to lead to contamination in the lithographic apparatus.

Embodiments of the invention may solve one or more of the above disadvantages.

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning devices may be transmissive or reflective. Examples of patterning device include masks, programmable mirror arrays, and programmable LCD panels. Masks are well known in lithography, and include mask types such a binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The term "projection system" used herein should be broadly interpreted as encompassing various types of projection system, including refractive optical systems, reflective optical systems, catadioptric optical systems, magnetic, electro-magnetic and electrostatic optical systems as appropriate for example for the exposure radiation being used, or for other factors such as the use of an immersion fluid or the use of a vacuum. Any use of the term "lens" herein may be considered as synonymous with the more general term "projection system".

The lithographic apparatus may also encompass various types of optical components, including refractive, reflective, catadioptric, magnetic, electro-magnetic and electrostatic optical components to direct, shape, or control the beam of radiation, and such components may also be referred to herein, collectively or singularly as a "lens".

The lithographic apparatus may be of a type having two (dual stage) or more substrate tables (and/or two or more mask tables). In such multiple stage machines the additional tables may be used in parallel, or preparatory steps may be carried out on one or more tables while one or more other tables are being used for exposure.

The lithographic apparatus may be of a type which allows rapid switching between two or more masks (or between patterns provided on a controllable patterning device), for example as described in U.S. Pat. Appl. Publ. No. 2007-0013890 A1, which is incorporated herein by reference in its entirety.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Although specific reference may be made in this text to the use of lithographic apparatus in the manufacture of integrated circuits, it should be understood that the lithographic apparatus described herein may have other applications, such as the manufacture of optical systems, guidance and detection patterns for magnetic domain memories, flat-panel displays, liquid-crystal displays (LCDs), or thin film magnetic heads.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm).

While specific embodiments of the invention have been described above, it will be appreciated that the invention may be practiced otherwise than as described.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A radiation beam modification apparatus for controlling a property of a beam of radiation in a lithographic apparatus, the radiation beam modification apparatus comprising:
   a flexible sheet provided with a plurality of apertures; and
   a positioning apparatus comprising a first rotatable member and a second rotatable member, wherein a first end portion of the flexible sheet is coupled to the first rotatable member, a second end portion of the flexible sheet is coupled to the second rotatable member and a central portion of the flexible sheet extends between the first rotatable member and the second rotatable member.

2. The apparatus of claim 1, wherein the flexible sheet is formed from a metal material.

3. The apparatus of claim 1, wherein the flexible sheet tapers inwardly towards at least one of the apertures.

4. The apparatus of claim 1, wherein the first rotatable member and the second rotatable member comprise a first cylindrical surface and a second cylindrical surface respectively, and wherein the first end portion of the flexible sheet is coupled to the first cylindrical surface and the second end portion of the flexible sheet is coupled to the second cylindrical surface.

5. The apparatus of claim 1, wherein the rotatable members are configured such that the first end portion may be wound onto the first rotatable member and unwound from the first rotatable member, and the second end portion may be wound onto the second rotatable member and unwound from the second rotatable member.

6. The apparatus of claim 1, further comprising an actuator configured to simultaneously rotate the first rotatable member and second rotatable member.

7. The apparatus of claim 1, further comprising two actuators, the first actuator being configured to rotate the first rotatable member and the second actuator being configured to rotate the second rotatable member.

8. The apparatus of claim 1, further comprising at least one cooling tube configured to allow cooling fluid to flow therethrough.

9. The apparatus of claim 8, wherein the at least one cooling tube is located adjacent to but not in contact with the flexible sheet.

10. The apparatus of claim 8, wherein the at least one cooling tube is in contact with the flexible sheet.

11. The apparatus of claim 1, wherein the apertures have different shapes.

12. The apparatus of claim 1, wherein the flexible sheet is provided with alignment marks.

13. A lithographic apparatus comprising:
   an illumination system for providing a beam of radiation;
   a support structure for supporting a patterning device, the patterning device serving to impart the radiation beam with a pattern in its cross-section;
   a substrate table for holding a substrate; and
   a projection system for projecting the patterned radiation beam onto a target portion of the substrate;
   wherein the lithographic apparatus further comprises a radiation beam modification apparatus comprising:
   a flexible sheet provided with a plurality of apertures; and
   a positioning apparatus comprising a first rotatable member and a second rotatable member, wherein a first end portion of the flexible sheet is coupled to the first rotatable member, a second end portion of the flexible sheet is coupled to the second rotatable member and a central portion of the flexible sheet extends between the first rotatable member and the second rotatable member.

14. The lithographic apparatus of claim 13, wherein the lithographic apparatus is an EUV lithographic apparatus.

15. The lithographic apparatus of claim 13, wherein the radiation beam modification apparatus is provided in the projection system of the lithographic apparatus.

16. The lithographic apparatus of claim 15, wherein the radiation beam modification apparatus is configured to provide adjustment of the numerical aperture of the radiation beam in the projection system.

17. The lithographic apparatus of claim 13, wherein the radiation beam modification apparatus is provided in the illumination system of the lithographic apparatus.

18. The lithographic apparatus of claim 17, wherein the radiation beam modification apparatus is configured to provide adjustment of the numerical aperture of the radiation beam in the illumination system.

19. A method of modifying a property of a radiation beam in a lithographic apparatus, the method comprising:
   providing a flexible sheet comprising a plurality of apertures;
   providing positioning apparatus comprising a first rotatable member and a second rotatable member, a first end portion of the flexible sheet being coupled to the first rotatable member, a second end portion of the flexible sheet being coupled to the second rotatable member, and a central portion of the flexible sheet extending between the first rotatable member and the second rotatable member; and
   using the positioning apparatus to position an aperture in the optical path of the beam of radiation and thereby modify a property of the radiation beam.

* * * * *